(12) United States Patent
Woodhouse et al.

(10) Patent No.: US 7,445,275 B2
(45) Date of Patent: Nov. 4, 2008

(54) SOLAR PANEL CONFIGURATION FOR VEHICLES

(75) Inventors: David Woodhouse, Newport Coast, CA (US); Tyler Blake, Rancho Santa Margarita, CA (US); Freeman Thomas, Laguna Beach, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 147 days.

(21) Appl. No.: 11/326,859

(22) Filed: Jan. 6, 2006

(65) Prior Publication Data

US 2007/0158978 A1  Jul. 12, 2007

(51) Int. Cl.
*B60J 7/00* (2006.01)
*H01L 31/042* (2006.01)

(52) U.S. Cl. .................. 296/211; 296/216.02; 136/251; 136/291

(58) Field of Classification Search .................. 296/211, 296/216.02, 220.01; 136/244, 251, 291
See application file for complete search history.

(56) References Cited

U.S. PATENT DOCUMENTS

| 4,181,188 A | * | 1/1980 | Dessert | 180/2.2 |
|---|---|---|---|---|
| 4,800,803 A | * | 1/1989 | Farmont | 454/129 |
| 5,344,361 A | * | 9/1994 | Matthias | 454/129 |
| 6,406,090 B1 | | 6/2002 | Tolinski et al. | |
| 6,439,654 B1 | * | 8/2002 | Teschner et al. | 296/211 |
| 6,550,852 B2 | * | 4/2003 | Patz et al. | 296/211 |
| 2005/0046241 A1 | | 3/2005 | Sasaki et al. | |

FOREIGN PATENT DOCUMENTS

| GB | 355448 | * | 8/1931 | |
| GB | 463048 | * | 11/1945 | 296/220.01 |
| IT | 518441 | * | 3/1957 | 296/216.02 |

OTHER PUBLICATIONS

Autocar, Dec. 19, 1930, p. E15, "Fresh-Air Saloon Roof", copy in 296/216.02.*

* cited by examiner

*Primary Examiner*—Dennis H Pedder
(74) *Attorney, Agent, or Firm*—Frank A. MacKenzie; Brooks Kushman P.C.

(57) ABSTRACT

A vehicle sunroof including a sunroof frame mounted to a vehicle roof opening and having opposing lateral sides. The sunroof frame has an outer edge adjacent to the outer surface of the vehicle roof and an inner edge located within the vehicle cabin. The vehicle sunroof also includes a number of solar panels. Each solar panel includes a solar collection surface for collecting sunlight for producing solar energy. The solar panels extend between and are connected to the opposing lateral sides of the sunroof frame.

8 Claims, 6 Drawing Sheets

SOLAR PANEL CONFIGURATION FOR VEHICLES

BACKGROUND OF THE INVENTION

1. Field of the Invention

One aspect of the present invention generally relates to a solar panel configuration for vehicles, and more specifically, to a sunroof having a number of solar panels for collecting sunlight and converting it into solar energy.

2. Background Art

The automotive industry has increased its emphasis on the research and development of alternative sources of energy for powering vehicles in light of the relatively limited supply of conventional power sources, such as fossil fuels. Non-limiting examples of such alternative sources include hydrogen fuel, methanol fuel and sunlight.

The implementation of such alternative sources of energy in the automotive setting has been met with various hurdles. In addition to technological feasibility concerns, the consumer public's acceptance of such technologies has also been an issue. For instance, many consumers question the ability of these technologies to deliver effective and cost efficient power to vehicles.

Notwithstanding the hurdles, the automotive industry has made a concerted effort to develop vehicles using alternative sources of energy because of the benefits that be achieved by such initiatives. For example, the use of alternative fuel sources is relatively cleaner and more environmentally friendly than the use of fossil fuels. Moreover, the cost of alternative fuel sources is relatively less expensive than fossil fuels. Additionally, although implementation of alternative fuel sources may be relatively expensive today, the technology is improving and becoming more cost efficient. This trend, coupled with the forecasted shortages on fossil fuel, may provide circumstances in the future where implementation of alternative fuel sources is actually less expensive than that of fossil fuels.

Solar energy derived from sunlight is exemplar of the benefits that can be achieved. Sunlight can be used to produce relatively clean power. Moreover, sunlight is freely available. Although the implementation of solar energy may represent a substantial cost today, it may turn out to be less expensive than the use of fossil fuels in the future.

In light of the foregoing, what is needed is a solar panel configuration for vehicles. Moreover, a sunroof having a number of solar panels for collecting sunlight and converting it into solar energy is needed.

SUMMARY OF THE INVENTION

According to one aspect of the present invention, a solar panel configuration for vehicles is provided. According to another aspect of the present invention, a sunroof having a number of solar panels for collecting sunlight and converting it into energy is provided.

In a first embodiment of the present invention, a vehicle sunroof is disclosed. The sunroof includes a sunroof frame mounted to a vehicle roof opening and having opposing lateral sides. The sunroof frame has an outer edge adjacent to the outer surface of the vehicle roof and an opposing inner edge. The sunroof also includes a number of solar panels, each having a solar collection surface for collecting sunlight for producing solar energy. The solar panels extend between and are connected to the opposing lateral sides of the sunroof frame.

According to a second embodiment of the present invention, a vehicle solar collection system is disclosed. The system includes one or more sunroof solar panels mounted within a sunroof frame, a pair of front sunroof solar panels, and a pair of rear sunroof solar panels. One of the front sunroof solar panels is adjacent to the left headlight and the other is adjacent to the right headlight. One of the rear sunroof solar panels is adjacent to the left taillight and the other is adjacent to the right taillight. The one or more sunroof solar panels, the pair of front sunroof solar panels, and the pair of rear sunroof solar panels are capable of collecting sunlight for conversion into solar energy.

In a third embodiment of the present invention, a vehicle sunroof is disclosed. The sunroof includes a sunroof frame mounted to a vehicle roof opening and having opposing lateral sides. The sunroof frame has an outer edge adjacent to the outer surface of the vehicle roof and an opposing inner edge. The sunroof also includes a number of solar panels, each having a solar collection surface for collecting sunlight for producing solar energy. The solar panels extend between and are connected to the opposing lateral sides of the sunroof frame. The number of solar panels are tiltably connected to the opposing lateral sides such that one or more of the solar panels are tiltable.

The above and other objects, features, and advantages of the present invention are readily apparent from the following detailed description of the best mode for carrying out the invention when taken in connection with the accompanying drawings.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompany drawings which:

FIG. 4b is a cross-sectional side view of the solar panels taken about line 4b-4b of FIG. 4a;

FIG. 5b is a cross-sectional side view of the solar panels taken about line 5b-5b of FIG. 5a;

DETAILED DESCRIPTION OF EMBODIMENTS OF THE PRESENT INVENTION

As required, detailed embodiments of the present invention are disclosed herein. However, it is to be understood that the disclosed embodiments are merely exemplary of the invention that may be embodied in various and alternative forms. Therefore, specific functional details described herein are not to be interpreted as limiting, but merely as a representative basis for the claims and/or as a representative basis for teaching one of ordinary skill in the art to variously employ the present invention.

Except where otherwise expressly indicated, all numerical quantities in this description indicating dimensions are to be understood as modified by the word "about" in describing the broadest scope of the invention. Practice within the numerical limits stated is generally preferred. Also, unless expressly stated to the contrary, the first definition of an acronym or other abbreviation applies to all subsequent uses herein of the same abbreviation and applies mutatis mutandis to normal grammatical variations of the initially defined abbreviation; and, unless expressly stated to the contrary measurement of a dimension is determined by the same technique as previously or later referenced for the same dimensions.

Figure 1:
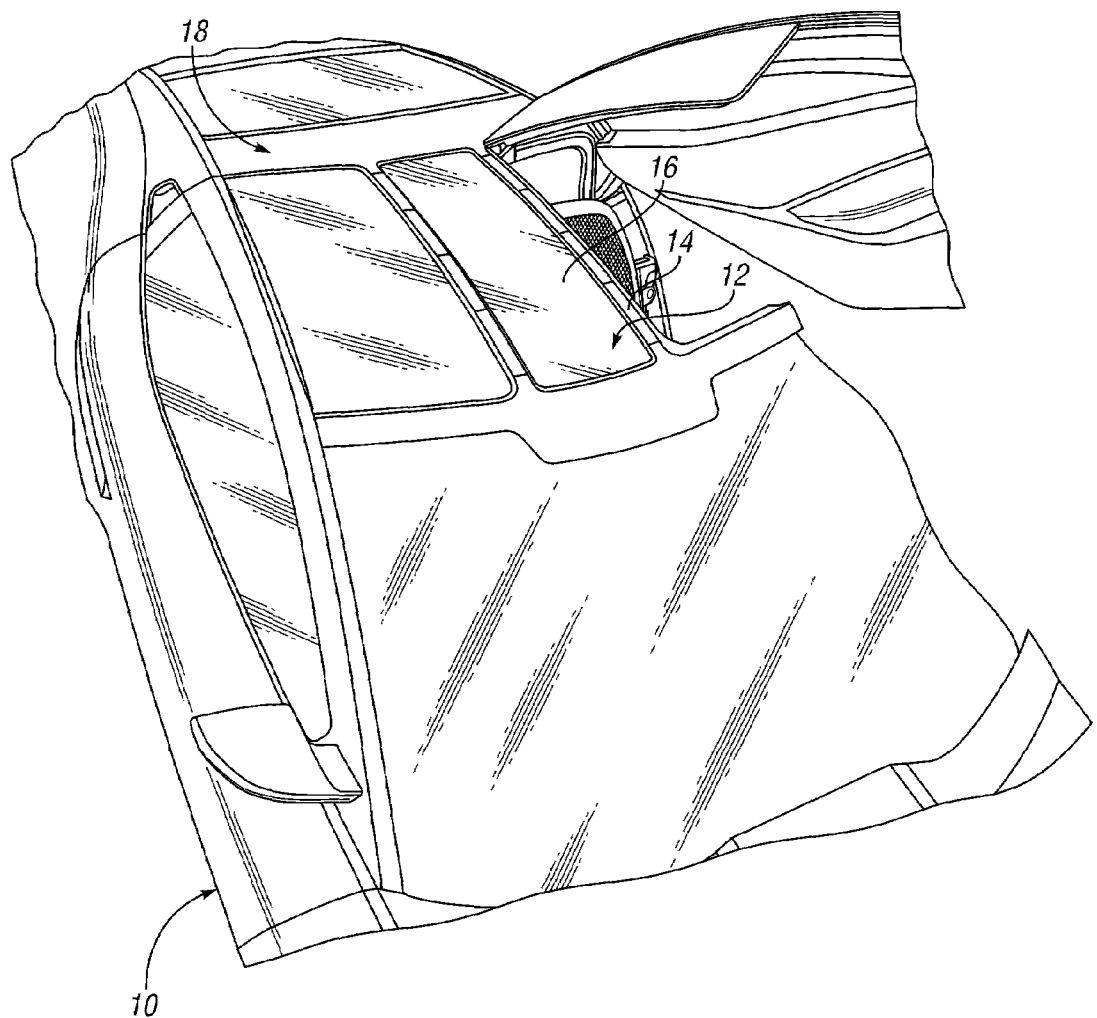
FIG. 1 is an perspective, top view of a vehicle having a sunroof according to one embodiment of the present invention.
Figure 2:
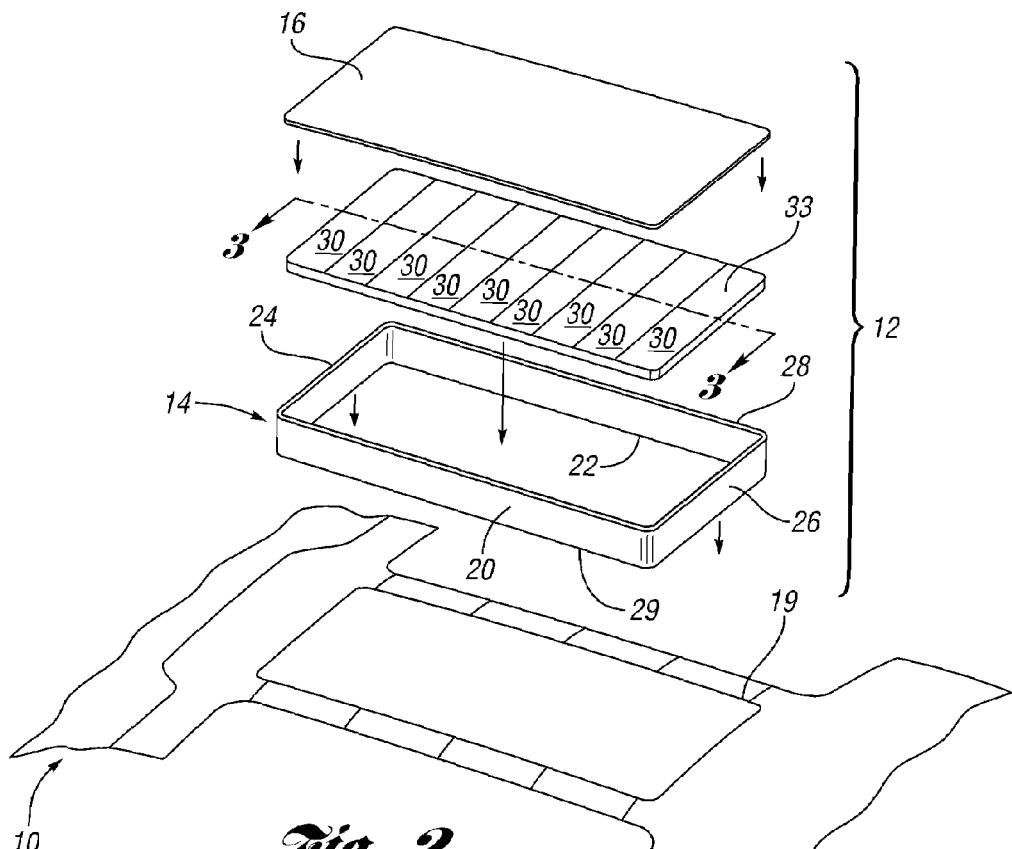
FIG. 2 is a perspective, top, exploded view of a the sunroof shown in FIG. 1.

FIGS. 1 and 2 depict a vehicle 10 having a sunroof 12 according to one embodiment of the present invention. The sunroof 12 includes a frame 14 and a panel 16. According to FIGS. 1 and 2, the frame 14 is connected to an opening 19 in vehicle roof 18, and is generally rectangular in shape, although other shapes, including squares and ovals, are contemplated within the scope of the present invention. The frame 14 is constructed of a metal alloy material, although other materials, such as a reinforced plastic, may be used based on the relative strength of the material. Frame 14 includes opposing lateral sides 20 and 22, rear side 24 and front side 26. Frame 14 has an outer edge 28 adjacent to the outer surface of the vehicle roof 18, and also has an opposing inner edge 29.

The panel 16 is transparent, although the panel can also have a semi-opaque quality depending on the implementation of the present invention. The periphery of panel 16 is connected to the frame 14 proximate to the outer edge 28 of frame 14. In certain embodiments, the panel 16 can be releasably attached to the frame 14 such that the panel 16 can be removed from the sunroof assembly 12. In other embodiments, the panel 16 is hingeably attached to the frame 14 such that the panel 16 can be locked in a closed position (as shown in FIG. 1) and translated and locked into an open position wherein an air flow can pass into at least a portion of the space defined within frame 14.

According to FIG. 2, a number of solar panels 30 are shown removed from sunroof frame 14. Each of the solar panels 30 can extend between and can be connected to opposing lateral sides 20 and 22. Each solar panel 30 includes a solar collection surface 33 for collecting sunlight for producing solar energy.

Figure 6:
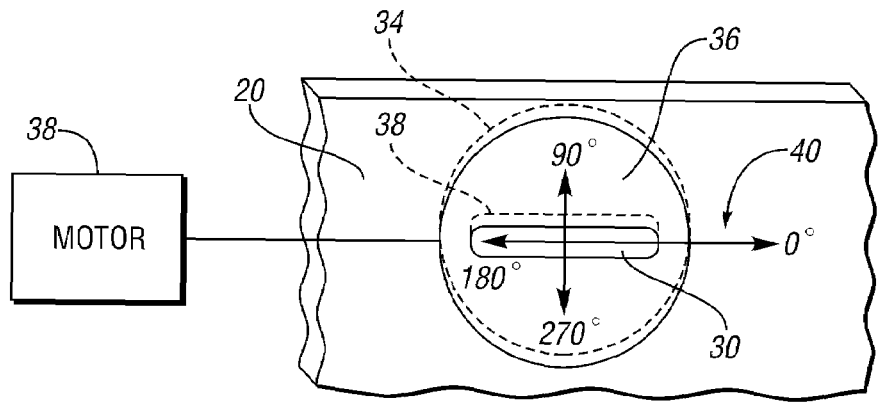
FIG. 6 is a side view of a lateral side of a sunroof frame according to one embodiment of the present invention.

In certain embodiments, the solar panels 30 are tiltably or rotatably connected to the opposing lateral sides 20 and 22 such that the solar panels 30 are rotatable. FIG. 6 depicts one assembly for connecting one end of a solar panel 30 to lateral side 20. It should be understood that the other end of solar panel 30 can be connected to lateral side 22 using the same connection assembly. According to FIG. 6, lateral side 20 includes a recess 34 for mounting and retaining a radial dial 36 having a 38 slot for receiving and retaining an end of solar panel 30. The radial dial 36 can be connected to a motor 38 for rotating the radial dial 36 to adjust the tilt angle, corresponding to the angle of rotation, of solar panel 30. It should be appreciated that the tilt angle of a single, a neighboring or non-neighboring group, or all solar panels 30 may be adjusted according to the implementation of the present invention.

Figure 3:
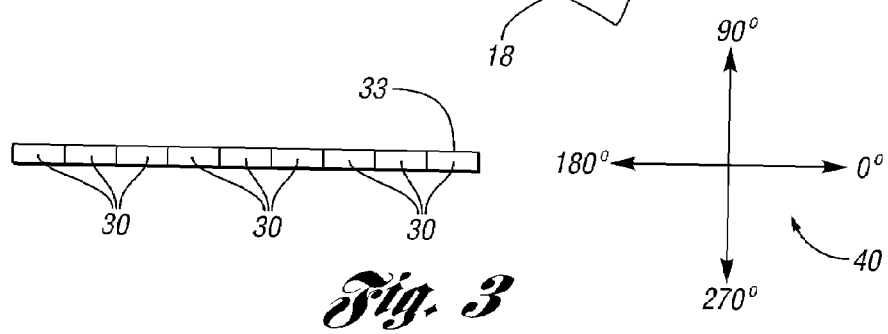
FIG. 3 is a cross-sectional side view of the solar panels taken about line 3-3 of FIG. 2.

FIG. 3 is a cross-sectional view of solar panels 30 taken about the line 3-3 of FIG. 2. The tilt angle of solar panels 30 is about 0 degrees, as signified by angle indicator 40. With a tilt angle of about 0 degrees, the solar panels 30 are substantially parallel to the vehicle platform, i.e., general plane of the vehicle frame or chassis, and the solar collection surfaces 33 are facing away from the vehicle platform.

Figure 4A:
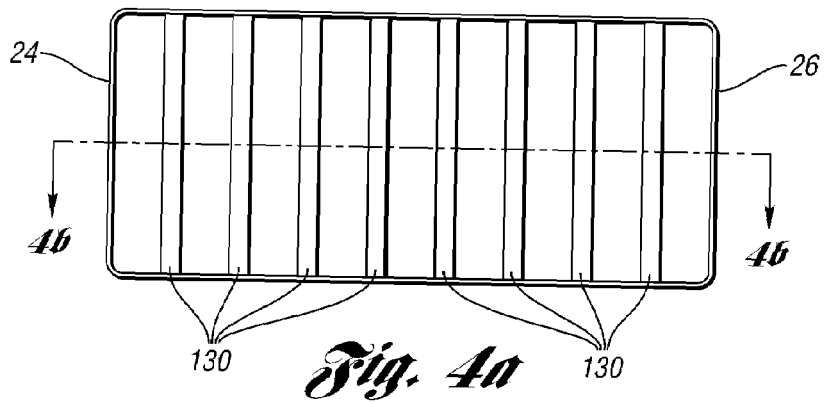
FIG. 4a is a top view of a sunroof incorporating a number of solar panels according to one embodiment of the present invention.
Figure 4B:
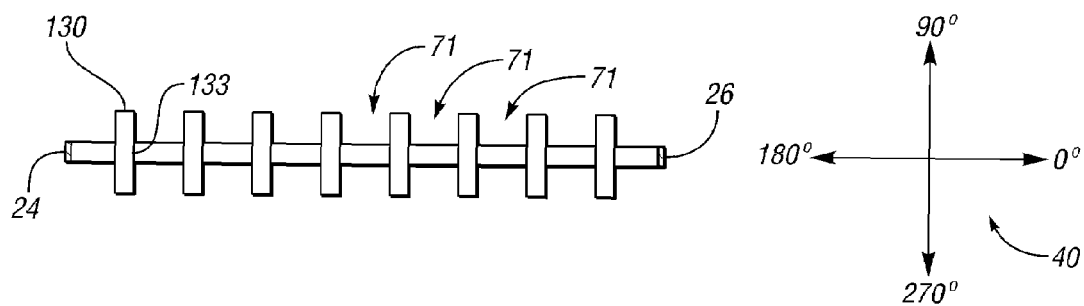
Figure 5A:
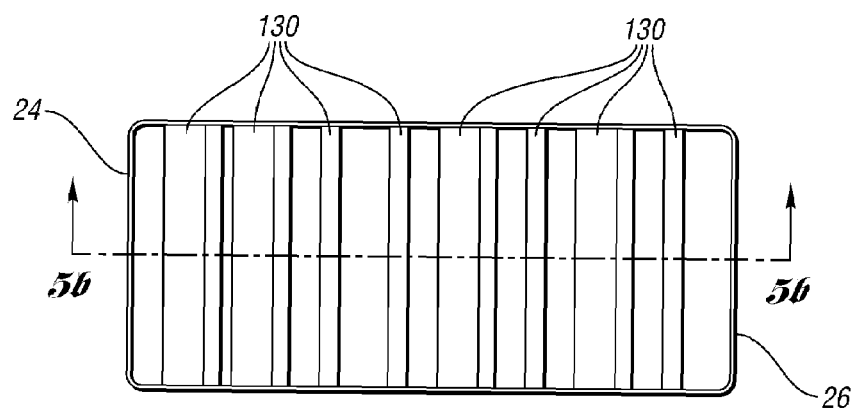
FIG. 5a is a top view of a sunroof incorporating a number of solar panels according to another embodiment of the present invention.
Figure 5B:
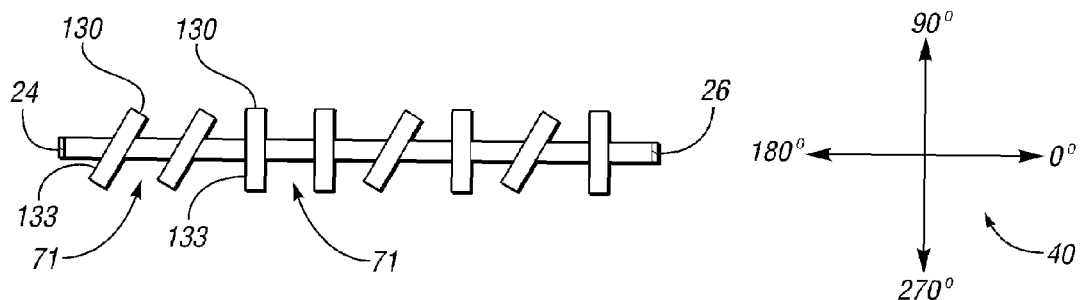

As detailed above, the tilt angle of one, several or all solar panels can be adjusted. For instance, FIGS. 4a and 4b depict an example wherein the tilt angle of all solar panels 130 is at 90 degrees, thereby orienting the solar collection surfaces 133 of solar panels 130 substantially perpendicular to the vehicle platform and facing towards the front of the vehicle. In another instance, FIGS. 5a and 5b depict an example wherein the tilt angle of a single, neighboring or non-neighboring group of less than all of the solar panels 130 can be adjustable relative to one another.

It should be appreciated that the tilt angle can be in the range of 0 to 360 degrees. In the case of a 180 degree tilt angle, the solar collection surfaces are substantially parallel to and are facing towards the vehicle platform. In the case of a 270 degree tilt angle, the solar collection surfaces 33 are substantially perpendicular to the vehicle platform and facing towards the rear of the vehicle.

According to certain embodiments of the present invention, the tilt angle of one, several or all solar panels can be adjust manually or automatically to optimize the gathering of sunlight based on the orientation of the sun in the sky. In certain embodiments, a micro processing unit (MPU) can be programmed with a schedule of sun orientation based on the geographic location of the vehicle. The MPU can also receive input from a global positioning system (GPS) for identifying the current vehicle location. Based on the current vehicle location and the sun orientation schedule, the MPU can determine the optimized position of the solar panels for gathering sunlight. In alternative embodiments, a manual dial or switch can manipulated by a vehicle occupant based on occupant's judgment of the sun orientation.

Figure 7:
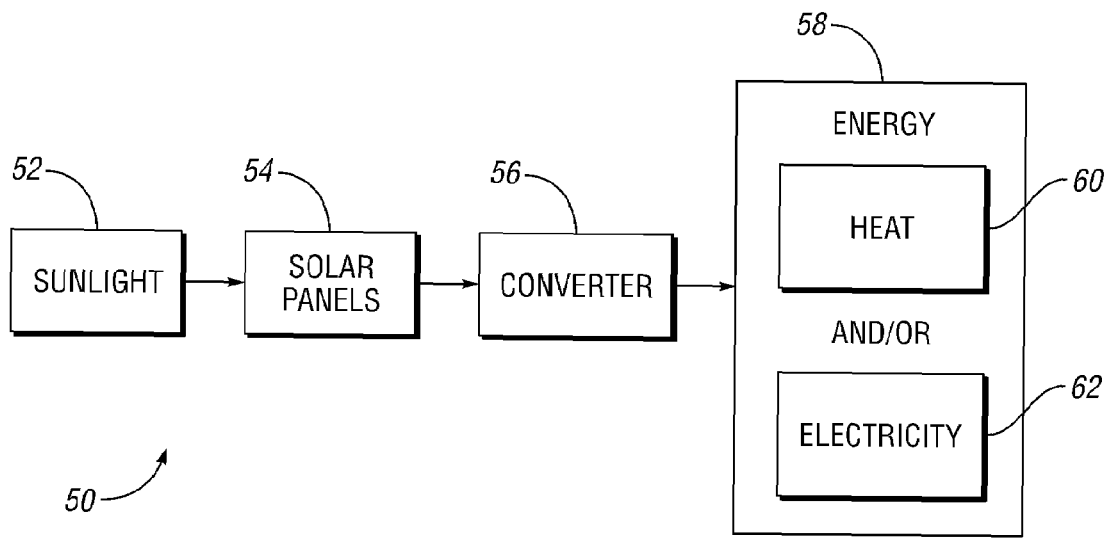
FIG. 7 is a flowchart depicting the generation of solar energy from sunlight according to one embodiment of the present invention.

FIG. 7 is a flowchart 50 depicting the generation of solar energy from sunlight according to one embodiment of the present invention. Sunlight 52 is collected on one or more solar panels 54. As depicted in block 56, the gathered sunlight is converted into energy 58 (heat 60 and/or electricity 62) by a converter. The converter can be photovoltaic cell which uses the sunlight to create an electron flow. According to another non-limiting example, the sunlight can be used to heat a fluid that is used in the operation of an engine or turbine-generator.

Figure 8:
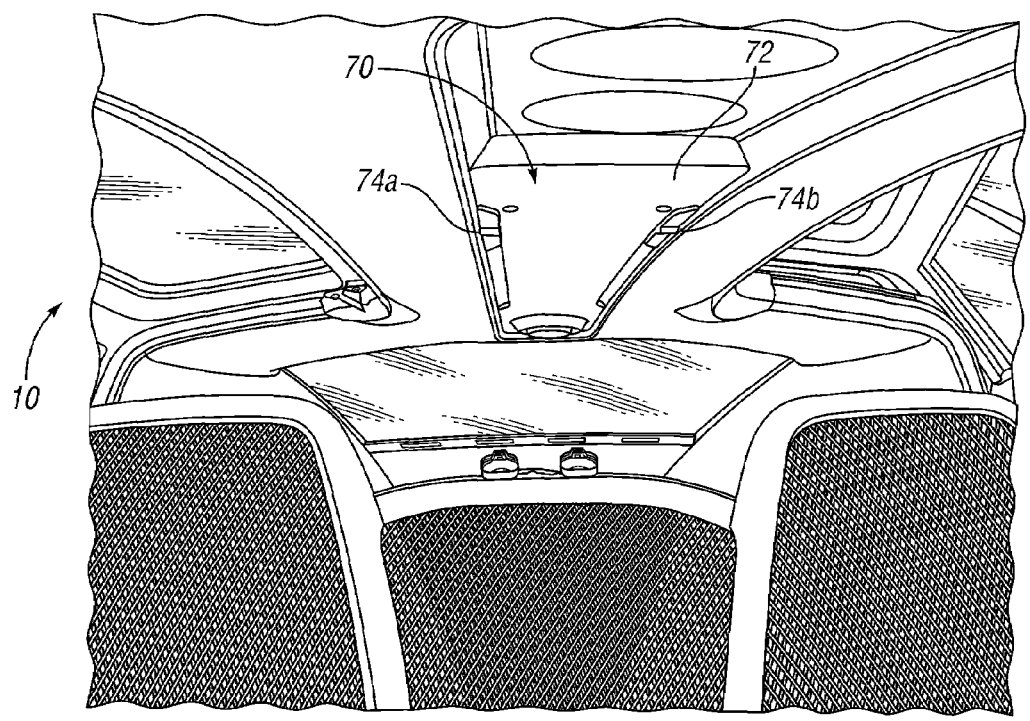
FIG. 8 is a perspective, interior view of a vehicle having a venting system according to one embodiment of the present invention.

FIG. 8 is a perspective, interior view of vehicle 10 having a venting system 70 according to one embodiment of the present invention. The venting system can include a baffle attached to inner edge 29 of the sunroof frame 14 for regulating the flow of air passing through one or more passageways 71 (best shown in FIGS. 4b and 5b) created by certain tilt angles. Venting panel 72 can be attached to the venting baffle. The venting panel 72 can include one or more switches, for example, slide switches 74a and 74b, for distributing air from the venting baffle to one or more locations within the vehicle cabin.

Figure 9:
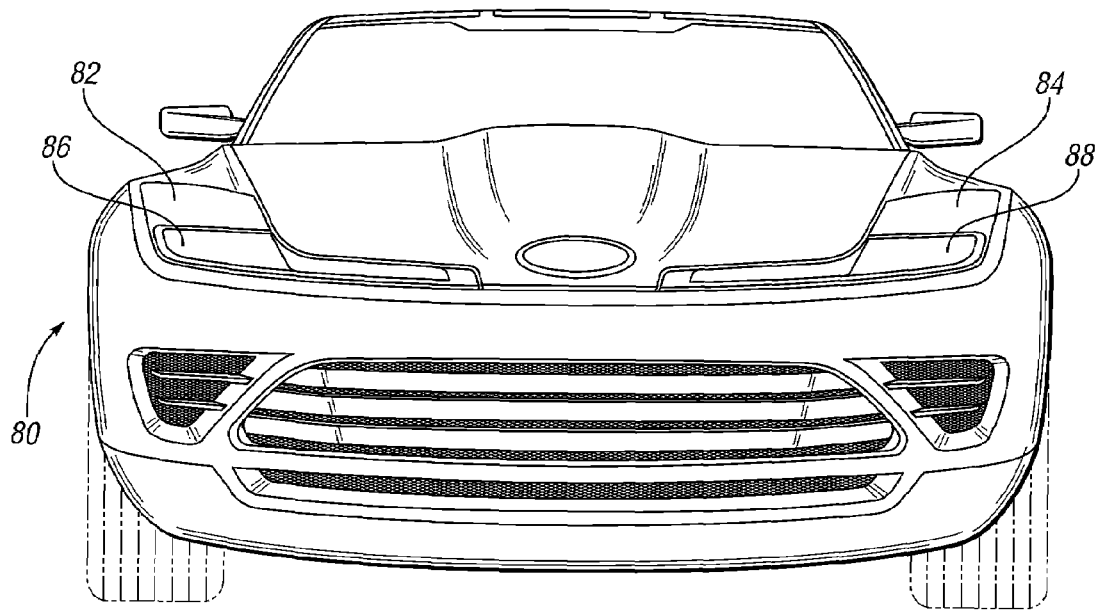
FIG. 9 is a perspective, front view of a vehicle having front solar panels according to one embodiment of the present invention.
Figure 10:
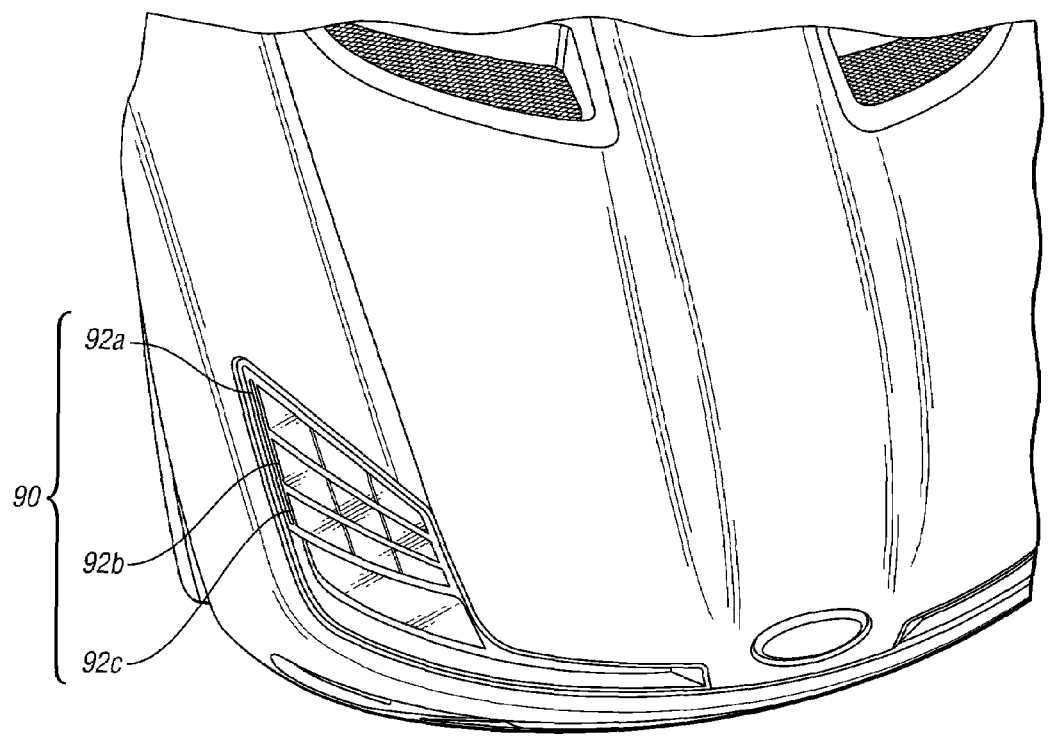
FIG. 10 is a perspective, top view of a front solar panel cluster according to one embodiment of the present invention.

FIG. 9 is a perspective, front view of a vehicle 80 having front solar panels 82 and 84 according to one embodiment of the present invention. The front right solar panel 82 is adjacent to the right headlight 86 and the front left solar panel 84 is adjacent to the left headlight 88. Solar panels 82 and 84 are capable of collecting sunlight for conversion into solar energy. FIG. 10 is a perspective, top view of a front solar panel cluster 90 including first, second and third solar panels 92a, 92b and 92c.

Figure 11:
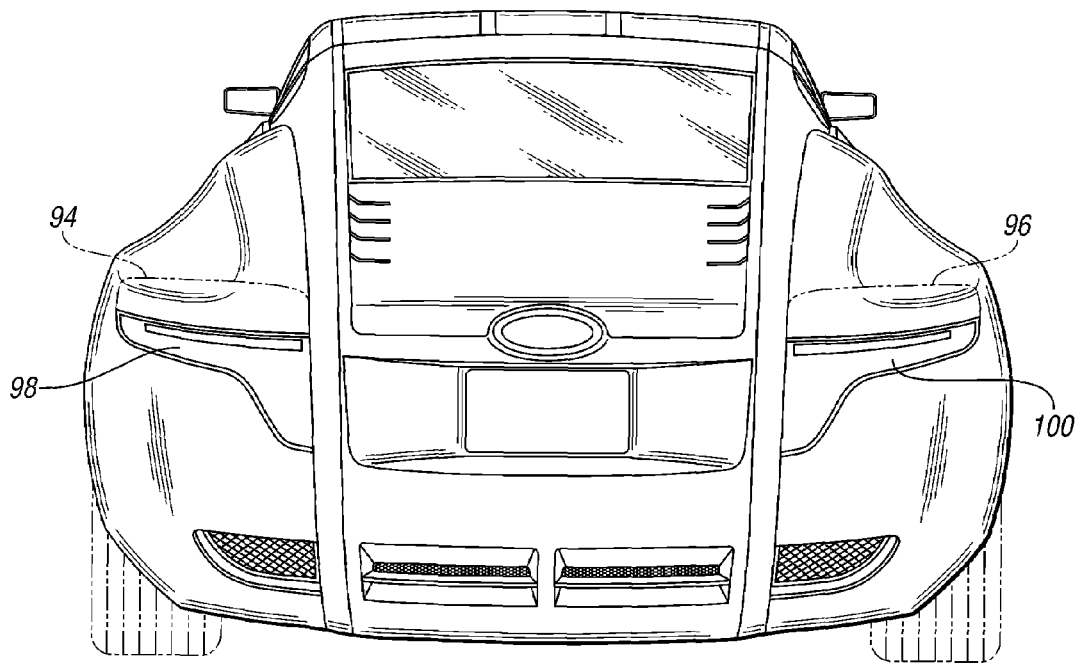
FIG. 11 is a perspective, rear view of a vehicle having rear solar panels according to one embodiment of the present invention.

FIG. 11 is a perspective, rear view of a vehicle 80 having rear solar panels 94 and 96 according to one embodiment of the present invention. The rear left solar panel 94 is adjacent to the left taillight 98 and the rear right solar panel 96 is adjacent to the right taillight 100. Solar panels 94 and 96 are capable of collecting sunlight for conversion into solar energy.

In certain embodiments, the sunroof solar panels, front solar panels and rear solar panels can be utilized in combination to collect sunlight for conversion into solar energy.

While the best mode for carrying out the invention has been described in detail, those familiar with the art to which this invention relates will recognize various alternative designs and embodiments for practicing the invention as defined by the following claims.

What is claimed:

1. A vehicle sunroof for a vehicle having a vehicle platform, the vehicle sunroof comprising:

a sunroof frame mounted to a vehicle roof opening and having opposing lateral sides, the sunroof frame having an outer edge adjacent to the outer surface of the vehicle roof and an opposing inner edge; and a number of solar panels, each having a solar collection surface for collecting sunlight for producing solar energy, the number of solar panels extending between and rotatably connected to the opposing lateral sides such that the number of solar panels are rotatable, each of the number of solar panels having a tilt angle;

wherein the tilt angle of a single, a neighboring or non-neighboring group of less than all of the number of solar panels is adjustable.

2. The vehicle sunroof of claim 1 wherein the tilt angle of the neighboring or non-neighboring group of solar panels is substantially equal.

3. The vehicle sunroof of claim 1 wherein the tilt angle of the neighboring or non-neighboring group of solar panels is about 0 degrees such that the number of solar panels lie in a common plane substantially parallel to the vehicle platform.

4. The vehicle sunroof of claim 1 wherein the tilt angle of each solar panel is greater than 0 degrees and less than 180 degrees relative to the vehicle platform such that the number of solar panels are spaced apart to create a passageway between each pair of solar panels for allowing the flow of air.

5. The vehicle sunroof of claim 4 further comprising a venting baffle attached to the inner edge of the sunroof frame for regulating the flow of air passing through the one or more passageways.

6. The vehicle sunroof of claim 5 further comprising a venting panel attached to the venting baffle, and one or more switches for distributing air from the venting baffle to one or more locations within the vehicle cabin.

7. The vehicle sunroof of claim 1 further comprising a panel positioned above the number of solar panels connected to the outer edge of the sunroof frame.

8. The vehicle sunroof of claim 7 wherein the panel is a transparent panel.

* * * * *